United States Patent [19]

Ciszek

[11] Patent Number: 4,586,007
[45] Date of Patent: Apr. 29, 1986

[54] NOTCH FILTER

[75] Inventor: Andrew Ciszek, Maple Shade, N.J.

[73] Assignee: RCA Corporation, Princeton, N.J.

[21] Appl. No.: 663,194

[22] Filed: Oct. 22, 1984

[51] Int. Cl.[4] ................................................. H03H 7/01
[52] U.S. Cl. .................................... 333/175; 333/174; 333/176
[58] Field of Search ............................ 333/167–171, 333/174–181, 32, 33, 129, 124; 358/31, 36, 38, 133, 167

[56] References Cited

U.S. PATENT DOCUMENTS 2,907,960 10/1959 Avins .................................... 333/176
3,103,554 9/1963 Avins et al. ...................... 333/176 X Primary Examiner—Marvin L. Nussbaum
Attorney, Agent, or Firm—Joseph S. Tripoli; Robert L. Troike; Raymond E. Smiley

[57] ABSTRACT

A two-cavity notch filter including an input terminal inductively coupled to an output terminal having a low impedance connection therebetween, a first relatively high impedance resonant tank circuit including the series combination of a circuit grounded capacitor and circuit grounded inductor having a tap point thereon, a capacitor and optionally in series therewith an inductor connected between the input terminal and tap point. The notch filter also includes a second relatively high impedance resonant tank circuit including the series connection of a circuit grounded capacitor and circuit grounded inductor having a tap thereon, and a capacitor and, optionally, in series therewith an inductor between the output terminal and tap point of the second tank circuit inductor. There is capacitive coupling between the capacitors forming the first and second tank circuits.

9 Claims, 5 Drawing Figures

NOTCH FILTER

BACKGROUND OF INVENTION

1. Field of Invention

This invention is concerned with notch filters, and more particularly notch filters capable of operating with a relatively narrow notch or missing frequency band and a relatively large signal attenuation in the notch.

2. Description of the Prior Art

There are TV satellite receiving antennas operating in C band at 3720 megahertz to 4480 megahertz which is the same band at which telephone company long line transmitters operate, creating the probability of signal interference. Such received signals are converted into the UHF band of 270 to 770 megahertz for further handling and processing. For purposes of providing operating power to amplifiers located at the antenna dish a dc (direct current) signal is also present with the UHF signal. Without filtering of the unwanted telephone frequencies the interference is visible on television sets. Therefore, filtering of the unwanted telephone signals is essential. Yet it is also essential that only the telephone frequencies are removed so as not to degrade the television signals. The type of filter wanted is a notch filter capable of removing only a narrow frequency band of 6 MHz (a center frequency $f_o \pm 3$ MHz) at 3 dB attenuation and a band of about 5 to 10 kilohertz ($f_o \pm 2.5$ KHz to $f_o \pm 5$ Khz) at 50 dB attenuation while passing all other frequencies with little or no attenuation.

Notch filters in general are known. Two companies which make commercial versions of notch filters are Blonder-Tongue Laboratories, Inc., One Jake Brown Rd., Old Bridge, N.J. 08857 and RF Systems Division, General Instruments Corporation, 4229 S. Fremont Ave., Tuscon, Ariz. 85714. Such filters operate in the VHF spectrum with an ac only input signal. Notch filters operating in the UHF frequency band capable of passing dc with attenuation of at least fifty decibels and removing only about 5 to 10 kilohertz at 50 dB attenuation are not available.

SUMMARY OF INVENTION

In accordance with a preferred embodiment of the present invention a notch filter comprises in combination, an input terminal, an output terminal, means inductively coupling the input terminal to the output terminal forming a relatively low impedance circuit therebetween. The filter also comprises first and second relatively high impedance energy storage resonant tank circuits, first means capacitively coupling the first energy storage resonant tank circuit to the input terminal providing dc blocking therebetween, the first means also including means for providing impedance matching therebetween. The notch filter also includes second means capacitively coupling the second energy storage resonant tank circuit to the output terminal for providing dc blocking therebetween, the second means also including means for providing impedance matching therebetween. The notch filter also includes means coupling the first and second tank circuits together to provide phase cancellation therebetween.

DETAILED DESCRIPTION OF THE PREFERRED EMBODIMENT

Figure 1:
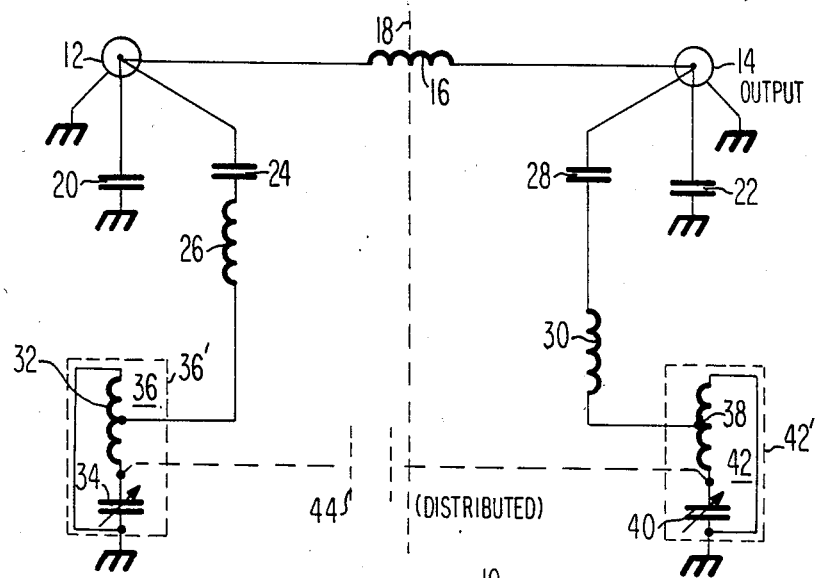
FIG. 1 is a notch filter in electrical schematic form in accordance with a preferred embodiment of the present invention.

Referring now to FIG. 1 a two-cavity notch filter 10 is illustrated which, with component values specified below, is suitable for use at UHF frequencies. The first cavity comprises all the components to the left of and on dashed line 18 while the second cavity comprises all components to the right of and on dashed line 18. Input terminal 12 is connected to output terminal 14 by a decoupling inductor 16. At UHF frequencies inductor 16 is in reality a 5.3 centimeter length of No. 12 copper wire having an inductance of 0.040 microhenries. Input terminal 12 and output terminal 14 typically are connected to other 75 ohm impedance circuits (not shown).

A first circuit grounded capacitor 20 is connected to input terminal 12 while a second similar capacitor 22 is connected to output terminal 14. Capacitors 20 and 22 accomplish three tasks: improve the filter VSWR (voltage standing wave ratio); reduce the coupling between the two cavities and improve the symmetry of the filter attenuation. In a UHF notch filter, a typical value for capacitors 20 and 22 is 0.75 picofarads.

Input terminal 12 is also connected to the series connection of a DC blocking capacitor 24 and an inductor 26. Capacitor 24 may typically be 270 picofarads while inductor 26 may typically be 0.12 microhenries in a UHF notch filter. Inductor 26 may be constructed by tightly winding ten turns of No. 26 insulated copper wire on a piece of number 12 wire acting as a temporary winding core. Capacitor 28 and inductor 30 are of identical values to those of capacitor 24 and inductor 26, respectively, and are identically arranged in relation to output terminal 14.

Inductor 32 and adjustable capacitor 34 are connected together and are connected at the distal ends thereof to circuit ground forming an energy storage resonant tank circuit 36 within dashed block 36'. Circuit 36 is a relatively high impedance compared to the 75 ohm impedance of the input and output circuit comprising terminals 12 and 14 and inductor 16. Inductor 32 is a tapped inductor, the tap point being connected to inductor 26. Capacitor 34 is a very high Q capacitor on the order of 5000 adjustable between 0.8 and 10 picofarads. The value to which capacitor 34 is adjusted depends on the frequency band to be attenuated by the notch filter. With capacitor 34 adjusted to 10 picofarads a frequency band on the order of 270 megahertz is attenuated whereas with capacitor 34 adjusted to 0.8 picofarads a frequency of 770 megahertz is attenuated. One exemplary capacitor 34 is Model No.MVM 010 M, manufactured by JFD Electronics Co., 9030 Highway 5, Douglasville, Ga. 30135.

Tapped inductor 32 typically comprises a length of silver plated No. 12 copper wire bent in a shape of an L having one leg 4.1 centimeters long and connected between inductor 26 and capacitor 34 and having a second leg 1.3 centimeters long connected between inductor 26 and circuit ground. The total inductance of conductor 32 is 0.041 microhenries with 0.031 microhenries in the 4.1 centimeter leg and 0.010 microhenries in the 1.3 centimeter leg. Tank circuit 36 is at a high impedance, on the order of 7.2 kilohms, compared to 75 ohm input-output circuit comprising terminals 12, 14 and inductor 16.

One purpose of the circuit comprising inductor 26 and capacitor 24 is to match the high impedance of tank circuit 36 with the low impedance of the input-output circuit. A second purpose is to pass part of the energy of the resonant tank circuit to the input terminal 12.

Inductor 38 and adjustable capacitor 40 are connected together with the distal ends of the inductor and capacitor connected to circuit ground forming a second energy storing resonant tank circuit 42 within dashed box 42'. Circuit components and construction are identical to those of circuit 36. The tap of inductor 38 is connected to the end of inductor 30. The purpose of inductor 30 and of capacitor 28 is to provide impedance matching between the tank circuit 42 and the input output circuit and to pass part of the energy from tank circuit 42 to output terminal 14.

A distributed capacitance 44 extends between the junction of capacitor 34 and inductor 32 at one end and the junction of capacitor 40 and inductor 38 on the other end. Capacitor 44 is not a real capacitor, but rather a phantom capacitor, and as such it is illustrated with dashed lines. The phantom capacitor is created by the way in which the notch filter is realized as will be described in connection with FIG. 2. The purpose of capacitor 44 is to provide phase cancellation between tank ciruits 36 and 42. In a notch filter operating in the UHF spectrum capacitor 44 has a value of 1 or 2 picofarads.

Figure 2B:
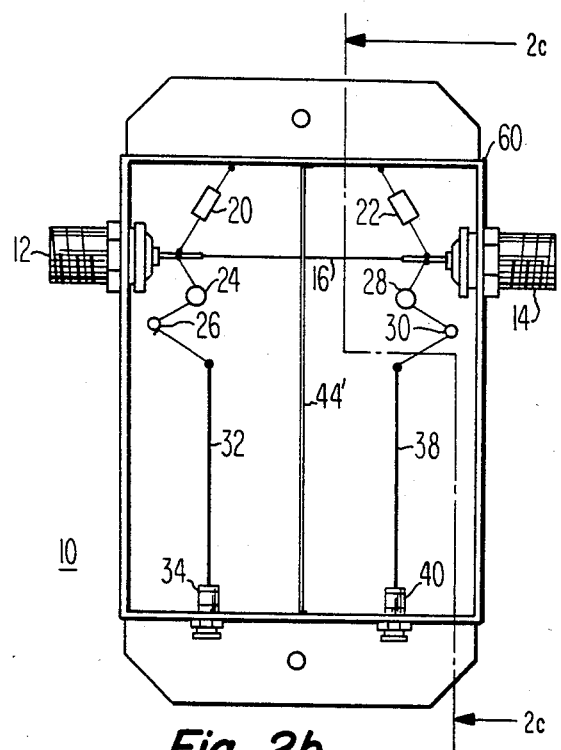
FIGS. 2a, 2b and 2c show the filter of FIG. 1 illustrating, in three views, the mechanical construction thereof.
Figure 2C:
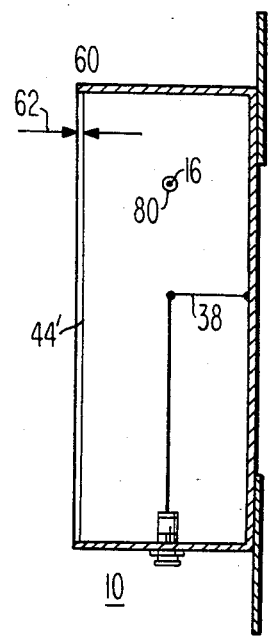
Figure 2A:
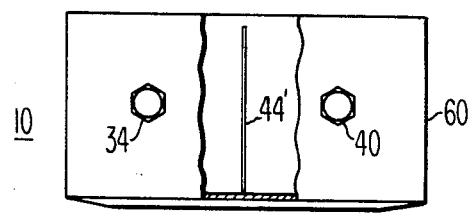

FIG. 2 consists of three views illustrating the mechanical construction of the notch filter 10. FIG. 2a is a front view illustrated partially broken away to show a cavity divider. FIG. 2b is a top view with the notch filter cover removed and FIG. 2c is a right side view along lines 2c—2c of FIG. 2b showing the cavity divider and attachment of an inductor. All components are mounted in a box 60 typically made of 18-gauge cold rolled steel. Capacitor 44 (FIG. 1) is created by the gap 62 (illustrated greatly exaggerated for drawing clarity) formed between cavity divider 44' and the top of an exemplary 7.6 centimeter loop box 60 as illustrated in FIGS. 2a and 2c. That gap is typically 1.25 millimeters to create a 1 or 2 picofarad capacitor. Cavity divider 44' is typically a rectangular sheet of tin, as best illustrated in FIG. 2b, which extends from one end of box 60 to the other, as illustrated in FIG. 2a and is soldered to box 60. As illustrated in FIG. 2c cavity divider 44' has an orifice 80 through which passes inductor wire 16. Inductor wire 38 (and, although not illustrated, inductor wire 32) is soldered to box 60 which is at circuit ground.

Operation of the filter of FIG. 1 is as follows. Capacitors 34 and 40 are first adjusted so tank circuits 36 and 42, respectively, resonate at the frequency desired to be attenuated. As a practical matter this is accomplished by placing the filter in the circuit where a narrow frequency band attenuation is desired due to interference having first been seen on a television monitor. A signal tap is temporarily placed between the filter and monitor. A spectrum analyzer is attached to the tap. The capacitors 34 and 40 are adjusted until the offending frequency band is attenuated and the picture clears up on the monitor. If there is more than one offending frequency band, more than one notch filter is required, each adjusted to a different frequency band. Because of capacitors 24 and 28, a direct current signal can be passed from input terminal 12 to output terminal 14 without disturbing the operation of tank circuits 36 and 42. Because of a low impedance between terminals 12 and 14, the through loss of signal is typically only one dB. Because of the nature of the tank circuits 36 and 42 and the presence of a distributed capacitor (FIG. 1) therebetween, a very large signal attenuation occurs on the order of 50 dB or more over a narrow frequency band of typically only 5 to 10 kilohertz.

Figure 3:
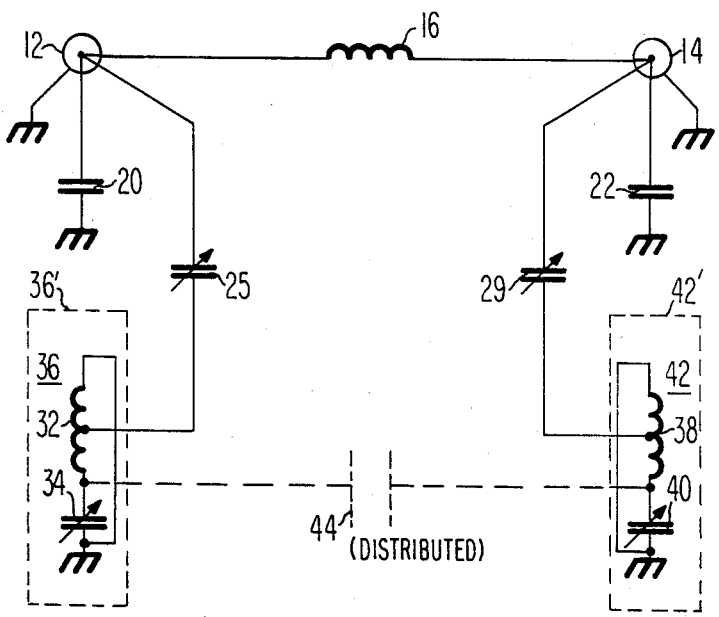
FIG. 3 is a second notch filter in electrical schematic form which is the electrical equivalent of the FIG. 1 notch filter.

FIG. 3 is identical to FIG. 1 except that capacitor 24 and inductor 26, FIG. 1, are replaced by adjustable capacitor 25, FIG. 3, and capacitor 28 and inductor 30, FIG. 1, are replaced by adjustable capacitor 29, FIG. 3. For a UHF notch filter operating at 270 to 750 megahertz capacitors 25 and 29 are each adjustable between 0.5 and 5 picofarads. The low value (0.5 picofarad) is chosen for use with a relatively high frequency notch and the high value capacitance (5 picofarads) is chosen for a relatively low frequency notch. An adjustable value capacitor is necessary because at high notch frequencies a high value of capacitance would cause an excessively large frequency attenuation band while at low notch frequencies a low value of capacitance would cause too little attenuation.

Some applications do not require 50 dB or more of attenuation. If 10 dB of attenuation is sufficient, the two cavities of the FIG. 1 notch filter or the FIG. 3 notch filter can be adjusted to attenuate two different frequency ranges. Thus, in FIGS. 1 and 3 capacitors 34 and 40 would be adjusted to resonate at two different frequencies. Additionally, in FIG. 3 capacitors 25 and 29 are adjusted to pass the selected frequencies.

What is claimed is:

1. A notch filter comprising in combination:
   an input terminal;
   an output terminal;
   means inductively coupling said input terminal to said output terminal forming a relatively low impedance circuit therebetween;
   first and second relatively high impedance energy storage resonant tank circuits;
   first means capacitively coupling said first energy storage resonant tank circuit to said input terminal providing direct current (dc) blocking therebetween, said first means also including means for providing impedance matching therebetween;
   second means capacitively coupling said second energy storage resonant tank circuit to said output terminal for providing dc blocking therebetween, said second means also including means for providing impedance matching therebetween; and
   means coupling said first and second tank circuits together to provide phase cancellation therebetween.

2. The combination as set forth in claim 1 wherein each of said first and second relatively high impedance energy storage resonant tank circuits comprises an adjustable capacitor in series with an inductor, the distal ends of each being connected to circuit ground and wherein said first means and second means are coupled to a tap point on the respective tank circuit inductors.

3. The combination as set forth in claim 1 wherein each of said first means and second means comprises a dc blocking capacitor series coupled with an inductor.

4. The combination as set forth in claim 2 wherein each of said first means and second means comprises a dc blocking capacitor series coupled with an inductor, the distal ends of said dc blocking capacitors being connected to the input and output terminals, respectively, the distal ends of said inductors being coupled to the tap points of said first and second tank circuits, respectively.

5. The combination as set forth in claim 1 wherein said means coupling said first and second tank circuits together comprises means capacitively coupling said first and second tank circuits together.

6. The combination as set forth in claim 5 wherein said means capacitively coupling said first and second tank circuits together comprises a phantom capacitor realized by the physical construction of said notch filter.

7. A two-cavity notch filter comprising in combination:
an input terminal;
an output terminal;
means inductively coupling said input terminal to said output terminal forming a relatively low impedance circuit therebetween;
a first capacitor connected between said input terminal and circuit ground;
a second capacitor connected between said output terminal and circuit ground;
first and second relatively high impedance energy storage resonant tank circuits, each tank circuit comprising the series connection of a capacitor and an inductor connected at their distal ends to circuit ground, each said inductor including a tap point;
first means capacitively coupling said tap point of said first energy storage resonant tank circuit to said input terminal providing direct current (dc) blocking therebetween, said first means also including means for providing impedance matching therebetween;
second means capacitively coupling said tap point of said second energy storage resonant tank circuit to said the output terminal for providing dc blocking therebetween, said second means also including means for providing impedance matching therebetween; and
means capacitively coupling said first and second tank circuits together to provide phase cancellation therebetween.

8. The combination as set forth in claim 7 wherein each of said first means and second means comprises a dc blocking capacitor series coupled with an inductor, the distal ends of said dc blocking capacitors being connected to the input and output terminals, respectively, the distal ends of said inductors being coupled to the tap points of said first and second tank circuits, respectively.

9. The combination as set forth in claim 8 wherein said means capacitively coupling said first and second tank circuits together comprises a phantom capacitor realized by the physical construction of said notch filter.

* * * * *